United States Patent
Keller et al.

(10) Patent No.: US 9,245,992 B2
(45) Date of Patent: *Jan. 26, 2016

(54) CARBON DOPING SEMICONDUCTOR DEVICES

(71) Applicant: Transphorm Inc., Goleta, CA (US)

(72) Inventors: Stacia Keller, Santa Barbara, CA (US); Brian L. Swenson, Goleta, CA (US); Nicholas Fichtenbaum, Newbury Park, CA (US)

(73) Assignee: Transphorm Inc., Goleta, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/208,304

(22) Filed: Mar. 13, 2014

(65) Prior Publication Data

US 2014/0264370 A1    Sep. 18, 2014

Related U.S. Application Data

(60) Provisional application No. 61/791,395, filed on Mar. 15, 2013.

(51) Int. Cl.
| | |
|---|---|
| *H01L 21/338* | (2006.01) |
| *H01L 29/778* | (2006.01) |
| *H01L 21/02* | (2006.01) |
| *H01L 29/66* | (2006.01) |

(Continued)

(52) U.S. Cl.
CPC ........ *H01L 29/7786* (2013.01); *H01L 21/0237* (2013.01); *H01L 21/0254* (2013.01); *H01L 21/0262* (2013.01); *H01L 21/02458* (2013.01); *H01L 21/02579* (2013.01); *H01L 29/66462* (2013.01); *H01L 29/7784* (2013.01); *H01L 29/2003* (2013.01); *H01L 29/207* (2013.01)

(58) Field of Classification Search
None
See application file for complete search history.

(56) References Cited

U.S. PATENT DOCUMENTS

| | | | |
|---|---|---|---|
| 4,300,091 | A | 11/1981 | Schade, Jr. |
| 4,645,562 | A | 2/1987 | Liao et al. |
| 4,728,826 | A | 3/1988 | Einzinger et al. |

(Continued)

FOREIGN PATENT DOCUMENTS

| | | |
|---|---|---|
| CN | 1748320 | 3/2006 |
| CN | 101107713 | 1/2008 |

(Continued)

OTHER PUBLICATIONS

Authorized officer Tae Hoon Kim, International Search Report and Written Opinion in PCT/US2014/027523, mailed Jul. 30, 2014, 14 pages.

(Continued)

*Primary Examiner* — Jack Chen
(74) *Attorney, Agent, or Firm* — Fish & Richardson P.C.

(57) ABSTRACT

A method of fabricating a semiconductor device can include forming a III-N semiconductor layer in a reactor and injecting a hydrocarbon precursor into the reactor, thereby carbon doping the III-N semiconductor layer and causing the III-N semiconductor layer to be insulating or semi-insulating. A semiconductor device can include a substrate and a carbon doped insulating or semi-insulating III-N semiconductor layer on the substrate. The carbon doping density in the III-N semiconductor layer is greater than $5 \times 10^{18}$ cm$^{-3}$ and the dislocation density in the III-N semiconductor layer is less than $2 \times 10^9$ cm$^{-2}$.

25 Claims, 3 Drawing Sheets

(51) Int. Cl.
*H01L 29/20* (2006.01)
*H01L 29/207* (2006.01)

(56) References Cited

U.S. PATENT DOCUMENTS

| | | | |
|---|---|---|---|
| 4,821,093 A | 4/1989 | Iafrate et al. |
| 4,914,489 A | 4/1990 | Awano |
| 5,051,618 A | 9/1991 | Lou |
| 5,329,147 A | 7/1994 | Vo et al. |
| 5,618,384 A | 4/1997 | Chan et al. |
| 5,646,069 A | 7/1997 | Jelloian et al. |
| 5,663,091 A | 9/1997 | Yen et al. |
| 5,705,847 A | 1/1998 | Kashiwa et al. |
| 5,714,393 A | 2/1998 | Wild et al. |
| 5,909,103 A | 6/1999 | Williams |
| 5,998,810 A | 12/1999 | Hatano et al. |
| 6,008,684 A | 12/1999 | Ker et al. |
| 6,097,046 A | 8/2000 | Plumton |
| 6,100,571 A | 8/2000 | Mizuta et al. |
| 6,292,500 B1 | 9/2001 | Kouchi et al. |
| 6,307,220 B1 | 10/2001 | Yamazaki |
| 6,316,793 B1 | 11/2001 | Sheppard et al. |
| 6,373,082 B1 | 4/2002 | Ohno et al. |
| 6,429,468 B1 | 8/2002 | Hsu et al. |
| 6,475,889 B1 | 11/2002 | Ring |
| 6,486,502 B1 | 11/2002 | Sheppard et al. |
| 6,504,235 B2 | 1/2003 | Schmitz et al. |
| 6,515,303 B2 | 2/2003 | Ring |
| 6,544,867 B1 * | 4/2003 | Webb et al. .......... 438/478 |
| 6,548,333 B2 | 4/2003 | Smith |
| 6,552,373 B2 | 4/2003 | Ando et al. |
| 6,580,101 B2 | 6/2003 | Yoshida |
| 6,583,454 B2 | 6/2003 | Sheppard et al. |
| 6,586,781 B2 | 7/2003 | Wu et al. |
| 6,624,452 B2 | 9/2003 | Yu et al. |
| 6,649,497 B2 | 11/2003 | Ring |
| 6,727,531 B1 | 4/2004 | Redwing et al. |
| 6,746,938 B2 | 6/2004 | Uchiyama et al. |
| 6,777,278 B2 | 8/2004 | Smith |
| 6,849,882 B2 | 2/2005 | Chavarkar et al. |
| 6,867,078 B1 | 3/2005 | Green et al. |
| 6,946,739 B2 | 9/2005 | Ring |
| 6,979,863 B2 | 12/2005 | Ryu |
| 6,982,204 B2 | 1/2006 | Saxler et al. |
| 7,030,428 B2 | 4/2006 | Saxler |
| 7,045,404 B2 | 5/2006 | Sheppard et al. |
| 7,071,498 B2 | 7/2006 | Johnson et al. |
| 7,078,743 B2 | 7/2006 | Murata et al. |
| 7,084,475 B2 | 8/2006 | Shelton et al. |
| 7,109,552 B2 | 9/2006 | Wu |
| 7,125,786 B2 | 10/2006 | Ring et al. |
| 7,126,212 B2 | 10/2006 | Enquist et al. |
| 7,161,194 B2 | 1/2007 | Parikh et al. |
| 7,169,634 B2 | 1/2007 | Zhao et al. |
| 7,170,111 B2 | 1/2007 | Saxler |
| 7,217,960 B2 | 5/2007 | Ueno et al. |
| 7,230,284 B2 | 6/2007 | Parikh et al. |
| 7,238,560 B2 | 7/2007 | Sheppard et al. |
| 7,250,641 B2 | 7/2007 | Saito et al. |
| 7,253,454 B2 | 8/2007 | Saxler |
| 7,265,399 B2 | 9/2007 | Sriram et al. |
| 7,268,375 B2 | 9/2007 | Shur et al. |
| 7,304,331 B2 | 12/2007 | Saito et al. |
| 7,321,132 B2 | 1/2008 | Robinson et al. |
| 7,326,971 B2 | 2/2008 | Harris et al. |
| 7,332,795 B2 | 2/2008 | Smith et al. |
| 7,364,988 B2 | 4/2008 | Harris et al. |
| 7,375,407 B2 | 5/2008 | Yanagihara et al. |
| 7,388,236 B2 | 6/2008 | Wu et al. |
| 7,419,892 B2 | 9/2008 | Sheppard et al. |
| 7,429,534 B2 | 9/2008 | Gaska et al. |
| 7,432,142 B2 | 10/2008 | Saxler et al. |
| 7,436,001 B2 | 10/2008 | Lee et al. |
| 7,449,730 B2 | 11/2008 | Kuraguchi |
| 7,456,443 B2 | 11/2008 | Saxler et al. |
| 7,465,967 B2 | 12/2008 | Smith et al. |
| 7,488,992 B2 | 2/2009 | Robinson |
| 7,501,669 B2 | 3/2009 | Parikh et al. |
| 7,501,670 B2 | 3/2009 | Murphy |
| 7,508,014 B2 | 3/2009 | Tanimoto |
| 7,544,963 B2 | 6/2009 | Saxler |
| 7,547,925 B2 | 6/2009 | Wong et al. |
| 7,550,783 B2 | 6/2009 | Wu et al. |
| 7,550,784 B2 | 6/2009 | Saxler et al. |
| 7,566,918 B2 | 7/2009 | Wu et al. |
| 7,573,078 B2 | 8/2009 | Wu et al. |
| 7,592,211 B2 | 9/2009 | Sheppard et al. |
| 7,598,108 B2 | 10/2009 | Li et al. |
| 7,601,993 B2 | 10/2009 | Hoshi et al. |
| 7,605,017 B2 | 10/2009 | Hayashi et al. |
| 7,612,390 B2 | 11/2009 | Saxler et al. |
| 7,615,774 B2 | 11/2009 | Saxler |
| 7,629,627 B2 | 12/2009 | Mil'shtein et al. |
| 7,638,818 B2 | 12/2009 | Wu et al. |
| 7,655,962 B2 | 2/2010 | Simin et al. |
| 7,678,628 B2 | 3/2010 | Sheppard et al. |
| 7,692,263 B2 | 4/2010 | Wu et al. |
| 7,700,973 B2 | 4/2010 | Shen et al. |
| 7,709,269 B2 | 5/2010 | Smith et al. |
| 7,709,859 B2 | 5/2010 | Smith et al. |
| 7,714,360 B2 | 5/2010 | Otsuka et al. |
| 7,723,739 B2 | 5/2010 | Takano et al. |
| 7,728,356 B2 | 6/2010 | Suh et al. |
| 7,745,851 B2 | 6/2010 | Harris |
| 7,755,108 B2 | 7/2010 | Kuraguchi |
| 7,759,699 B2 | 7/2010 | Beach |
| 7,759,700 B2 | 7/2010 | Ueno et al. |
| 7,777,252 B2 | 8/2010 | Sugimoto et al. |
| 7,777,254 B2 | 8/2010 | Sato |
| 7,795,622 B2 | 9/2010 | Kikkawa et al. |
| 7,795,642 B2 | 9/2010 | Suh et al. |
| 7,812,369 B2 | 10/2010 | Chini et al. |
| 7,834,380 B2 | 11/2010 | Ueda et al. |
| 7,851,825 B2 | 12/2010 | Suh et al. |
| 7,855,401 B2 | 12/2010 | Sheppard et al. |
| 7,859,014 B2 | 12/2010 | Nakayama et al. |
| 7,859,021 B2 | 12/2010 | Kaneko |
| 7,875,537 B2 | 1/2011 | Suvorov et al. |
| 7,875,907 B2 | 1/2011 | Honea et al. |
| 7,875,910 B2 | 1/2011 | Sheppard et al. |
| 7,875,914 B2 | 1/2011 | Sheppard |
| 7,884,394 B2 | 2/2011 | Wu et al. |
| 7,884,395 B2 | 2/2011 | Saito |
| 7,892,974 B2 | 2/2011 | Ring et al. |
| 7,893,500 B2 | 2/2011 | Wu et al. |
| 7,898,004 B2 | 3/2011 | Wu et al. |
| 7,901,994 B2 | 3/2011 | Saxler et al. |
| 7,906,799 B2 | 3/2011 | Sheppard et al. |
| 7,915,643 B2 | 3/2011 | Suh et al. |
| 7,915,644 B2 | 3/2011 | Wu et al. |
| 7,919,791 B2 | 4/2011 | Flynn et al. |
| 7,928,475 B2 | 4/2011 | Parikh et al. |
| 7,932,539 B2 | 4/2011 | Chen et al. |
| 7,935,985 B2 | 5/2011 | Mishra et al. |
| 7,948,011 B2 | 5/2011 | Rajan et al. |
| 7,955,918 B2 | 6/2011 | Wu et al. |
| 7,955,984 B2 | 6/2011 | Ohki |
| 7,960,756 B2 | 6/2011 | Sheppard et al. |
| 7,982,242 B2 | 7/2011 | Goto |
| 7,985,986 B2 | 7/2011 | Heikman et al. |
| 7,985,987 B2 | 7/2011 | Kaneko |
| 8,049,252 B2 | 11/2011 | Smith et al. |
| 8,076,698 B2 | 12/2011 | Ueda et al. |
| 8,076,699 B2 | 12/2011 | Chen et al. |
| 8,110,425 B2 | 2/2012 | Yun |
| 8,153,515 B2 | 4/2012 | Saxler |
| 8,174,048 B2 | 5/2012 | Beach |
| 8,178,900 B2 | 5/2012 | Kurachi et al. |
| 8,223,458 B2 | 7/2012 | Mochizuki et al. |
| 8,237,198 B2 | 8/2012 | Wu et al. |
| 8,264,003 B2 | 9/2012 | Herman |
| 8,361,816 B2 | 1/2013 | Lee et al. |
| 8,389,975 B2 | 3/2013 | Kikuchi et al. |
| 8,390,000 B2 | 3/2013 | Chu et al. |

(56) References Cited

U.S. PATENT DOCUMENTS

| | | |
|---|---|---|
| 8,404,042 B2 | 3/2013 | Mizuhara et al. |
| 8,431,960 B2 | 4/2013 | Beach et al. |
| 8,455,885 B2 | 6/2013 | Keller et al. |
| 8,471,267 B2 | 6/2013 | Hayashi et al. |
| 8,476,125 B2 | 7/2013 | Khan et al. |
| 8,492,779 B2 | 7/2013 | Lee |
| 8,502,323 B2 | 8/2013 | Chen |
| 8,519,438 B2 | 8/2013 | Mishra et al. |
| 8,525,231 B2 | 9/2013 | Park et al. |
| 8,603,880 B2 | 12/2013 | Yamada |
| 8,614,460 B2 | 12/2013 | Matsushita |
| 8,652,948 B2 | 2/2014 | Horie et al. |
| 8,674,407 B2 | 3/2014 | Ando et al. |
| 8,698,198 B2 | 4/2014 | Kuraguchi |
| 8,716,141 B2 | 5/2014 | Dora et al. |
| 8,772,832 B2 | 7/2014 | Boutros |
| 2003/0006437 A1 | 1/2003 | Mizuta et al. |
| 2004/0041169 A1 | 3/2004 | Ren et al. |
| 2004/0119067 A1 | 6/2004 | Weeks, Jr. et al. |
| 2004/0155250 A1 | 8/2004 | Ohba |
| 2005/0133816 A1 | 6/2005 | Fan et al. |
| 2005/0189561 A1 | 9/2005 | Kinzer et al. |
| 2005/0189562 A1 | 9/2005 | Kinzer et al. |
| 2006/0043499 A1 | 3/2006 | De Cremoux et al. |
| 2006/0060871 A1 | 3/2006 | Beach |
| 2006/0076677 A1 | 4/2006 | Daubenspeck et al. |
| 2006/0102929 A1 | 5/2006 | Okamoto et al. |
| 2006/0145189 A1 | 7/2006 | Beach |
| 2006/0189109 A1 | 8/2006 | Fitzgerald |
| 2006/0202272 A1 | 9/2006 | Wu et al. |
| 2006/0226442 A1 | 10/2006 | Zhang et al. |
| 2007/0018199 A1 | 1/2007 | Sheppard et al. |
| 2007/0018210 A1 | 1/2007 | Sheppard |
| 2007/0045670 A1 | 3/2007 | Kuraguchi |
| 2007/0080672 A1 | 4/2007 | Yang |
| 2007/0128743 A1 | 6/2007 | Huang et al. |
| 2007/0131968 A1 | 6/2007 | Morita et al. |
| 2007/0145417 A1 | 6/2007 | Brar et al. |
| 2007/0205433 A1 | 9/2007 | Parikh et al. |
| 2007/0210329 A1 | 9/2007 | Goto |
| 2007/0224710 A1 | 9/2007 | Palacios et al. |
| 2007/0228477 A1 | 10/2007 | Suzuki et al. |
| 2007/0249119 A1 | 10/2007 | Saito |
| 2007/0295985 A1 | 12/2007 | Weeks, Jr. et al. |
| 2008/0054247 A1 | 3/2008 | Eichler et al. |
| 2008/0073670 A1 | 3/2008 | Yang et al. |
| 2008/0093621 A1 | 4/2008 | Takeda et al. |
| 2008/0135829 A1* | 6/2008 | Lee .................. 257/13 |
| 2008/0283844 A1 | 11/2008 | Hoshi et al. |
| 2008/0308813 A1 | 12/2008 | Suh et al. |
| 2009/0045438 A1 | 2/2009 | Inoue et al. |
| 2009/0050936 A1 | 2/2009 | Oka |
| 2009/0072269 A1 | 3/2009 | Suh et al. |
| 2009/0075455 A1 | 3/2009 | Mishra |
| 2009/0085065 A1 | 4/2009 | Mishra et al. |
| 2009/0140262 A1 | 6/2009 | Ohki et al. |
| 2009/0201072 A1 | 8/2009 | Honea et al. |
| 2009/0278144 A1 | 11/2009 | Sonobe et al. |
| 2010/0065923 A1 | 3/2010 | Charles et al. |
| 2010/0067275 A1 | 3/2010 | Wang et al. |
| 2010/0133506 A1 | 6/2010 | Nakanishi et al. |
| 2010/0203234 A1 | 8/2010 | Anderson et al. |
| 2010/0219445 A1 | 9/2010 | Yokoyama et al. |
| 2011/0012110 A1 | 1/2011 | Sazawa et al. |
| 2012/0217512 A1 | 8/2012 | Renaud |
| 2012/0267637 A1 | 10/2012 | Jeon et al. |
| 2013/0020581 A1 | 1/2013 | Teraguchi et al. |
| 2013/0056744 A1 | 3/2013 | Mishra et al. |
| 2013/0328061 A1 | 12/2013 | Chu et al. |
| 2014/0084346 A1 | 3/2014 | Tajiri |
| 2014/0264455 A1 | 9/2014 | Keller et al. |

FOREIGN PATENT DOCUMENTS

| | | |
|---|---|---|
| CN | 101312207 | 11/2008 |
| CN | 101897029 | 11/2010 |
| CN | 102017160 | 4/2011 |
| CN | 103477543 | 12/2013 |
| CN | 103493206 | 1/2014 |
| EP | 1 998 376 | 12/2008 |
| EP | 2 188 842 | 5/2010 |
| JP | 11-224950 | 8/1999 |
| JP | 2000-058871 | 2/2000 |
| JP | 2000-068498 | 3/2000 |
| JP | 2001-135813 | 5/2001 |
| JP | 2003-229566 | 8/2003 |
| JP | 2003-244943 | 8/2003 |
| JP | 2004-260114 | 9/2004 |
| JP | 2006-032749 | 2/2006 |
| JP | 2006-033723 | 2/2006 |
| JP | 2007-036218 | 2/2007 |
| JP | 2007-215331 | 8/2007 |
| JP | 2008-199771 | 8/2008 |
| JP | 2010-087076 | 4/2010 |
| JP | 2010-525023 | 7/2010 |
| JP | 2010-171416 | 8/2010 |
| JP | 2010-539712 | 12/2010 |
| TW | 200924068 | 6/2009 |
| TW | 200924201 | 6/2009 |
| TW | 200947703 | 11/2009 |
| TW | 201010076 | 3/2010 |
| TW | 201027759 | 7/2010 |
| TW | 201027912 | 7/2010 |
| TW | 201036155 | 10/2010 |
| TW | 201322443 | 6/2013 |
| WO | WO 2004/070791 | 8/2004 |
| WO | WO 2004/098060 | 11/2004 |
| WO | WO 2005/070007 | 8/2005 |
| WO | WO 2005/070009 | 8/2005 |
| WO | WO 2006/114883 | 11/2006 |
| WO | WO 2007/077666 | 7/2007 |
| WO | WO 2007/108404 | 9/2007 |
| WO | WO 2008/120094 | 10/2008 |
| WO | WO 2009/036181 | 3/2009 |
| WO | WO 2009/036266 | 3/2009 |
| WO | WO 2009/039028 | 3/2009 |
| WO | WO 2009/039041 | 3/2009 |
| WO | WO 2009/076076 | 6/2009 |
| WO | WO 2009/132039 | 10/2009 |
| WO | WO 2010/039463 | 4/2010 |
| WO | WO 2010/068554 | 6/2010 |
| WO | WO 2010/090885 | 8/2010 |
| WO | WO 2010/132587 | 11/2010 |
| WO | WO 2011/031431 | 3/2011 |
| WO | WO 2011/072027 | 6/2011 |
| WO | WO 2013/052833 | 4/2013 |

OTHER PUBLICATIONS

Authorized officer Sang Won Choi, International Search Report and Written Opinion in PCT/US2013/024470, mailed May 27, 2013, 12 pages.

Authorized officer Simin Baharlou, International Preliminary Report on Patentability in PCT/US2013/024470, mailed Aug. 14, 2014, 9 pages.

Authorized officer June Young Son, International Search Report and Written Opinion in PCT/US2014/016298, mailed May 23, 2014, 15 pages.

Authorized officer June Young Son, International Search Report and Written Opinion in PCT/US2014/024191, mailed Aug. 7, 2014, 11 pages.

Arulkumaran et al., "Enhancement of Breakdown Voltage by AlN Buffer Layer Thickness in AlGaN/GaN High-electron-mobility Transistors on 4 in. Diameter Silicon," Applied Physics Letters, 2005, 86:123503-1-3.

Barnett and Shinn, "Plastic and Elastic Properties of Compositionally Modulated Thin Films," Annu. Rev. Mater. Sci., 1994, 24:481-511.

Cheng et al., "Flat GaN Epitaxial Layers Grown on Si(111) by Metalorganic Vapor Phase Epitaxy Using Step-graded AlGaN Intermediate Layers," Journal of Electronic Materials, 2006, 35(4):592-598.

(56) References Cited

OTHER PUBLICATIONS

Marchand et al., "Metalorganic Chemical Vapor Deposition on GaN on Si(111): Stress Control and Application to Filed-effect Transistors," Journal of Applied Physics, 2001, 89(12):7846-7851.
Reiher et al., "Efficient Stress Relief in GaN Heteroepitaxy on Si(111) Using Low-temperature AlN Interlayers," Journal of Crystal Growth, 2003, 248:563-567.
Authorized officer Chung Keun Lee, International Search Report and Written Opinion in PCT/US2008/076030, mailed Mar. 23, 2009, 10 pages.
Authorized officer Yolaine Cussac, International Preliminary Report on Patentability in PCT/US2008/076030, Mar. 25, 2010, 5 pages.
Authorized officer Chung Keun Lee, International Search Report and Written Opinion in PCT/US2008/076079, mailed Mar. 20, 2009, 11 pages.
Authorized officer Nora Lindner, International Preliminary Report on Patentability in PCT/US2008/076079, mailed Apr. 1, 2010, 6 pages.
Authorized officer Keon Hyeong Kim, International Search Report and Written Opinion in PCT/US2008/076160 mailed Mar. 18, 2009, 11 pages.
Authorized officer Simin Baharlou, International Preliminary Report on Patentability in PCT/US2008/076160, mailed Mar. 25, 2010, 6 pages.
Authorized officer Chung Keun Lee, International Search Report and Written Opinion in PCT/US2008/076199, mailed Mar. 24, 2009, 11 pages.
Authorized officer Dorothée Mülhausen, International Preliminary Report on Patentability in PCT/US2008/076199, mailed Apr. 1, 2010, 6 pages.
Authorized officer Keon Hyeong Kim, International Search Report and Written Opinion in PCT/US2008/085031, mailed Jun. 24, 2009, 11 pages.
Authorized officer Yolaine Cussac, International Preliminary Report on Patentability in PCT/US2008/085031, mailed Jun. 24, 2010, 6 pages.
Authorized officer Tae Hoon Kim, International Search Report and Written Opinion in PCT/US2009/041304, mailed Dec. 18, 2009, 13 pages.
Authorized officer Dorothée Mülhausen, International Preliminary Report on Patentability, in PCT/US2009/041304, mailed Nov. 4, 2010, 8 pages.
Authorized officer Sung Hee Kim, International Search Report and the Written Opinion in PCT/US2009/057554, mailed May 10, 2010, 13 pages.
Authorized Officer Gijsbertus Beijer, International Preliminary Report on Patentability in PCT/US2009/057554, mailed Mar. 29, 2011, 7 pages.
Authorized officer Cheon Whan Cho, International Search Report and Written Opinion in PCT/US2009/066647, mailed Jul. 1, 2010, 16 pages.
Authorized officer Athina Nikitas-Etienne, International Preliminary Report on Patentability in PCT/US2009/066647, mailed Jun. 23, 2011, 12 pages.
Authorized officer Sung Chan Chung, International Search Report and Written Opinion for PCT/US2010/021824, mailed Aug. 23, 2010, 9 pages.
Authorized officer Beate Giffo-Schmitt, International Preliminary Report on Patentability in PCT/US2010/021824, mailed Aug. 18, 2011, 6 pages.
Authorized officer Sang Ho Lee, International Search Report and Written Opinion in PCT/US2010/034579, mailed Dec. 24, 2010, 9 pages.
Authorized officer Nora Lindner, International Preliminary Report on Patentability in PCT/US2010/034579, mailed Nov. 24, 2011, 7 pages.
Authorized officer Jeongmin Choi, International Search Report and Written Opinion in PCT/US2010/046193, mailed Apr. 26, 2011, 13 pages.
Authorized officer Philippe Bécamel, International Preliminary Report on Patentability in PCT/US2010/046193, mailed Mar. 8, 2012, 10 pages.
Authorized officer Sang Ho Lee, International Search Report and Written Opinion in PCT/US2010/059486, mailed Jul. 26, 2011, 9 pages.
Authorized officer Nora Lindner, International Preliminary Report on Patentability in PCT/US2010/059486, mailed Jun. 21, 2012, 6 pages.
Authorized officer Kwan Sik Sul, International Search Report and Written Opinion in PCT/US2011/063975, mailed May 18, 2012, 8 pages.
Authorized officer Simin Baharlou, International Preliminary Report on Patentability in PCT/US2011/063975, mailed Jun. 27, 2013, 5 pages.
Authorized officer Sang-Taek Kim, International Search Report and Written Opinion in PCT/US2011/061407, mailed May 22, 2012, 10 pages.
Authorized officer Lingfei Bai, International Preliminary Report on Patentability in PCT/US2011/061407, mailed Jun. 6, 2013, 7 pages.
Authorized officer Kwan Sik Sul, International Search Report and Written Opinion in PCT/US2012/023160, mailed May 24, 2012, 9 pages.
Authorized officer Simin Baharlou, International Preliminary Report on Patentability in PCT/US2012/023160, mailed Aug. 15, 2013, 6 pages.
Authorized officer Jeongmin Choi, International Search Report and Written Opinion in PCT/US2012/027146, mailed Sep. 24, 2012, 12 pages.
Authorized officer Athina Nickitas-Etienne, International Preliminary Report on Patentability in PCT/US2012/027146, mailed Sep. 19, 2013, 9 pages.
Authorized officer Tae Hoon Kim, International Search Report and Written Opinion in PCT/US2013/035837, mailed Jul. 30, 2013, 9 pages.
Authorized officer Hye Lyun Park, International Search Report and Written Opinion in PCT/US2013/050914, mailed on Oct. 18, 2013, 11 pages.
European Search Report in Application No. 10 81 5813.0, mailed Mar. 12, 2013, 9 pages.
Search Report and Action in TW Application No. 098132132, issued Dec. 6, 2012, 8 pages.
Chinese First Office Action for Application No. 200880120050.6, Aug. 2, 2011, 10 pages.
Chinese First Office Action for Application No. 200980114639.X, May 14, 2012, 13 pages.
Ando et al., "10-W/mm AlGaN—GaN HFET with a Field Modulating Plate," IEEE Electron Device Letters, 2003, 24(5):289-291.
Arulkumaran et al. "Surface Passivation Effects on AlGaN/GaN High-Electron-Mobility Transistors with $SiO_2$, $Si_3N_4$, and Silicon Oxynitride," Applied Physics Letters, 2004, 84(4):613-615.
Chen et al., "High-performance AlGaN/GaN Lateral Field-effect Rectifiers Compatible with High Electron Mobility Transistors," Applied Physics Letters, 2008, 92, 253501-1-3.
Coffie, "Characterizing and Suppressing DC-to-RF Dispersion in AlGaN/GaN High Electron Mobility Transistors," 2003, PhD Thesis, University of California, Santa Barbara, 169 pages.
Coffie et al., "Unpassivated p-GaN/AlGaN/GaN HEMTs with 7.1 W/mm at 10 GhZ," Electronic Letters, 2003, 39(19):1419-1420.
Chu et al., "1200-V Normally Off GaN-on-Si Field-effect Transistors with Low Dynamic On-Resistance," IEEE Electron Device Letters, 2011, 32(5):632-634.
Dora et al., "High Breakdown Voltage Achieved on AlGaN/GaN HEMTs with Integrated Slant Field Plates," IEEE Electron Device Letters, 2006, 27(9):713-715.
Dora et al., "$ZrO_2$ Gate Dielectrics Produced by Ultraviolet Ozone Oxidation for GaN and AlGaN/GaN Transistors," J. Vac. Sci. Technol. B, 2006, 24(2)575-581.
Dora, "Understanding Material and Process Limits for High Breakdown Voltage AlGaN/GaN HEMTs," PhD Thesis, University of California, Santa Barbara, Mar. 2006, 157 pages.

(56) References Cited

OTHER PUBLICATIONS

Fanciulli et al., "Structural and Electrical Properties of $HfO_2$ Films Grown by Atomic Layer Deposition on Si, Ge, GaAs and GaN," Mat. Res. Soc. Symp. Proc., 2004, vol. 786, 6 pages.

Green et al., "The Effect of Surface Passivation on the Microwave Characteristics of Undoped AlGaN/GaN HEMT's," IEEE Electron Device Letters, 2000, 21(6):268 270.

Gu et al., "AlGaN/GaN MOS Transistors using Crystalline $ZrO_2$ as Gate Dielectric," Proceedings of SPIE, 2007, vol. 6473, 64730S-1-8.

Higashiwaki et al. "AlGaN/GaN Heterostructure Field-Effect Transistors on 4H-SiC Substrates with Current-Gain Cutoff Frequency of 190 GHz," Applied Physics Express, 2008, 021103-1-3.

Hwang et al., "Effects of a Molecular Beam Epitaxy Grown AlN Passivation Layer on AlGaN/GaN Heterojunction Field Effect Transistors," Solid-State Electronics, 2004, 48:363-366.

Im et al., "Normally Off GaN MOSFET Based on AlGaN/GaN Heterostructure with Extremely High 2DEG Density Grown on Silicon Substrate," IEEE Electron Device Letters, 2010, 31(3):192-194.

Karmalkar and Mishra, "Enhancement of Breakdown Voltage in AlGaN/GaN High Electron Mobility Transistors Using a Field Plate," IEEE Transactions on Electron Devices, 2001, 48(8):1515-1521.

Karmalkar and Mishra, "Very High Voltage AlGaN/GaN High Electron Mobility Transistors Using a Field Plate Deposited on a Stepped Insulator," Solid-State Electronics, 2001, 45:1645-1652.

Keller et al., "GaN—GaN Junctions with Ultrathin AlN Interlayers: Expanding Heterojunction Design." Applied Physics Letters, 2002, 80(23):4387-4389.

Keller et al., "Method for Heteroepitaxial Growth of High Quality N-Face GaN, InN and AlN and their Alloys by Metal Organic Chemical Vapor Deposition," U.S. Appl. No. 60/866,035, filed Nov. 15, 2006, 31 pages.

Khan et al., "AlGaN/GaN Metal Oxide Semiconductor Heterostructure Field Effect Transistor," IEEE Electron Device Letters, 2000, 21(2):63-65.

Kim, "Process Development and Device Characteristics of AlGaN/GaN HEMTs for High Frequency Applications," PhD Thesis, University of Illinois at Urbana-Champaign, 2007, 120 pages.

Kumar et al., "High Transconductance Enhancement-mode AlGaN/GaN HEMTs on SiC Substrate," Electronics Letters, 2003, 39(24):1758-1760.

Kuraguchi et al., "Normally-off GaN-MISFET with Well-controlled Threshold Voltage," Phys. Stats. Sol., 2007, 204(6):2010-2013.

Lanford et al., "Recessed-gate Enhancement-mode GaN HEMT with High Threshold Voltage," Electronic Letters, 2005, 41(7):449-450.

Lee et al., "Self-aligned Process for Emitter- and Base-regrowth GaN HBTs and BJTs," Solid-State Electronics, 2001, 45:243-247.

Mishra et al., "N-face High Electron Mobility Transistors with Low Buffer Leakage and Low Parasitic Resistance," U.S. Appl. No. 60/908,914, filed Mar. 29, 2007, 21 pages.

Mishra et al., "Polarization-induced Barriers for N-face Nitride-based Electronics," U.S. Appl. No. 60/940,052, filed May 24, 2007, 29 pages.

Mishra et al., "Growing N-polar III-nitride structures," U.S. Appl. No. 60/972,467, filed Sep. 14, 2007, 7 pages.

Mishra et al., "AlGaN/GaN HEMTs—An Overview of Device Operation and Applications," Proceedings of the IEEE, 2002, 90(6):1022-1031.

Nanjo et al., "Remarkable Breakdown Voltage Enhancement in AlGaN Channel High Electron Mobility Transistors," Applied Physics Letters 92 (2008), 3 pages.

Napierala et al., "Selective GaN Epitaxy on Si(111) Substrates Using Porous Aluminum Oxide Buffer Layers," Journal of the Electrochemical Society, 2006. 153(2):G125-G127, 4 pages.

Ota and Nozawa, "AlGaN/GaN Recessed MIS-gate HFET with High-threshold-voltage Normally-off Operation for Power Electronics Applications," IEEE Electron Device Letters, 2008, 29(7):668-670.

Palacios et al., "AlGaN/GaN HEMTs with an InGaN-based Back-barrier," Device Research Conference Digest, 2005, DRC '05 63rd, pp. 181-182.

Palacios et al., "AlGaN/GaN High Electron Mobility Transistors with InGaN Back-Barriers," IEEE Electron Device Letters, 2006, 27(1):13-15.

Palacios et al., "Fluorine Treatment to Shape the Electric Field in Electron Devices, Passivate Dislocations and Point Defects, and Enhance the Luminescence Efficiency of Optical Devices," U.S. Appl. No. 60/736,628, filed Nov. 15, 2005, 21 pages.

Palacios et al., "Nitride-based High Electron Mobility Transistors with a GaN Spacer," Applied Physics Letters, 2006, 89:073508-1-3.

Pei et al., "Effect of Dielectric Thickness on Power Performance of AlGaN/GaN HEMTs," IEEE Electron Device Letters, 2009, 30(4):313-315.

"Planar, Low Switching Loss, Gallium Nitride Devices for Power Conversion Applications," SBIR N121-090 (Navy), 2012, 3 pages.

Rajan et al., "Advanced Transistor Structures Based on N-face GaN," 32M International Symposium on Compound Semiconductors (ISCS), Sep. 18-22, 2005, Europa-Park Rust, Germany, 2 pages.

Saito et al., "Recessed-gate Structure Approach Toward Normally Off High-voltage AlGaN/GaN HEMT for Power Electronics Applications," IEEE Transactions on Electron Device, 2006, 53(2):356-362.

Shelton et al., "Selective Area Growth and Characterization of AlGaN/GaN Heterojunction Bipolar Transistors by Metalorganic Chemical Vapor Deposition," IEEE Transactions on Electron Devices, 2001, 48(3):490-494.

Shen, "Advanced Polarization-based Design of AlGaN/GaN HEMTs," Jun. 2004, PhD Thesis, University of California, Santa Barbara, 192 pages.

Sugiura et al., "Enhancement-mode *n*-channel GaN MOSFETs Fabricated on *p*-GaN Using $HfO_2$ as Gate Oxide," Electronics Letters, 2007, vol. 43, No. 17, 2 pages.

Suh et al., "High Breakdown Enhancement Mode GaN-based HEMTs with Integrated Slant Field Plate," U.S. Appl. No. 60/822,886, filed Aug. 18, 2006, 16 pages.

Suh et al. "High-Breakdown Enhancement-mode AlGaN/GaN HEMTs with Integrated Slant Field-Plate," Electron Devices Meeting, 2006, IEDM '06 International, 3 pages.

Suh et al., "III-Nitride Devices with Recessed Gates," U.S. Appl. No. 60/972,481, filed Sep. 14, 2007, 18 pages.

Tipirneni et al. "Silicon Dioxide-encapsulated High-Voltage AlGaN/GaN HFETs for Power-Switching Applications," IEEE Electron Device Letters, 2007, 28(9):784-786

Vetury et al., "Direct Measurement of Gate Depletion in High Breakdown (405V) Al/GaN/GaN Heterostructure Field Effect Transistors," IEDM 98, 1998, pp. 55-58.

Wang et al., "Comparison of the Effect of Gate Dielectric Layer on 2DEG Carrier Concentration in Strained AlGaN/GaN Heterostructure," Mater. Res. Soc. Symp. Proc., 2007, vol. 831, 6 pages.

Wang et al., "Enhancement-mode $Si_3N_4$/AlGaN/GaN MISHFETs," IEEE Electron Device Letters, 2006, 27(10):793-795.

Wu, "AlGaN/GaN Microwave Power High-Mobility Transistors," PhD Thesis, University of California, Santa Barbara, Jul. 1997, 134 pages.

Wu et al., "A 97.8% Efficient GaN HEMT Boost Converter with 300-W Output Power at 1MHz," Electronic Device Letters, 2008, IEEE, 29(8):824-826.

Yoshida, "AlGan/GaN Power FET," Furukawa Review, 2002, 21:7-11.

Zhang, "High Voltage GaN HEMTs with Low On-resistance for Switching Applications," PhD Thesis, University of California, Santa Barbara, Sep. 2002, 166 pages.

Zhanghong Content, Shanghai Institute of Metallurgy, Chinese Academy of Sciences, "Two-Dimensional Electron Gas and High Electron Mobility Transistor (HEMT)," Dec. 31, 1984, 17 pages.

(56) References Cited

OTHER PUBLICATIONS

Bahat-Treidel et al., "AlGaN/GaN/GaN:C back-barrier HFETs with breakdown voltage of over 1 kV and low $R_{ON} \times A$," IEEE Transactions on Electron Devices, 2010, 57(11):3050-3058.

Hou et al., "Carbon doping and etching of $Al_xGa_{1-x}As$ ($0 \leq x \leq 1$) with carbon tetrachloride in metalorganic vapor phase epitaxy," Appl. Phys. Lett., 1997, 70(26):3600-3602.

Kato et al., "C-doped GaN buffer layers with high breakdown voltages for high-power operation AlGaN/GaN HFETs on 4-in Si substrates by MOVPE," Journal of Crystal Growth, 2007, 298:831-834.

Kawanishi and Tomizawa, "Carbon-doped $p$-type (0001) plane AlGaN (Al = 6-55%) with high hole density," Phys. Status Solidi. B, 2012, 249(3):459-463.

Sugiyama et al., "Design of AlGaN/GaN HFETs with high breakdown voltage with carbon-doped GaN on conductive GaN substrate," presentation on Oct. 17, 2012, at the IWN2012 International Workshop on Nitride Semiconductors 2012, Sapporo, Japan, 2 pages.

Zhang and Kuech, "Photoluminescence of carbon in situ doped GaN grown by halide vapor phase epitaxy," Applied Physics Letters, 1998, 72(13):1611-1613.

Authorized officer Agnès Wittmann-Regis, International Preliminary Report on Patentability in PCT/US2013/035837, mailed Oct. 23, 2014, 6 pages.

Authorized officer Yukari Nakamura, International Preliminary Report on Patentability in PCT/US2013/050914, mailed Jan. 29, 2015, 8 pages.

\* cited by examiner

CARBON DOPING SEMICONDUCTOR DEVICES

CROSS-REFERENCE TO RELATED APPLICATION

This application claims priority to U.S. Provisional Application No. 61/791,395, filed on Mar. 15, 2013. The disclosure of the prior application is considered part of and is incorporated by reference in the disclosure of this application.

TECHNICAL FIELD

This disclosure relates generally to fabricating semiconductor devices, and in particular to carbon doping semiconductor devices.

BACKGROUND

Many transistors used in power electronic applications have been fabricated with silicon (Si) semiconductor materials. Common transistor devices for power applications include Si CoolMOS, Si Power MOSFETs, and Si Insulated Gate Bipolar Transistors (IGBTs). While Si power devices are inexpensive, they suffer from a number of disadvantages, including relatively low switching speeds and high levels of electrical noise. More recently, silicon carbide (SiC) power devices have been considered due to their superior properties. III-Nitride or III-N semiconductor devices, such as gallium nitride (GaN) based devices, are now emerging as attractive candidates to carry large currents, support high voltages, and to provide very low on-resistance and fast switching times.

SUMMARY

A method of fabricating a semiconductor device can include forming a III-N semiconductor layer in a reactor and, while forming the III-N semiconductor layer, injecting a hydrocarbon precursor into the reactor, thereby carbon doping the III-N semiconductor layer and causing the III-N semiconductor layer to be insulating or semi-insulating.

A semiconductor device can include a substrate and a carbon doped insulating or semi-insulating III-N semiconductor layer on the substrate. The carbon doping density in the III-N semiconductor layer is greater than $5 \times 10^{18}$ or $1 \times 10^{19}$ $cm^{-3}$, and a dislocation density in the III-N semiconductor layer is less than $2 \times 10^9$ $cm^{-2}$.

Methods and devices described herein can each include one or more of the following features. Injecting the hydrocarbon precursor can comprise injecting a hydrocarbon precursor having a chemical formula ($C_xH_y$), where x and y are integers greater than or equal to 1. Forming the III-N semiconductor layer on the substrate can comprise forming the III-N semiconductor layer as a III-N buffer layer over a III-N nucleation layer over a silicon substrate. Methods can comprise forming a III-N channel layer over the III-N buffer layer and forming a III-N barrier layer over the III-N channel layer, thereby forming a two-dimensional electron gas (2DEG) active channel adjacent to an interface between the channel layer and the barrier layer. Forming the III-N semiconductor layer as a III-N buffer layer can comprise forming the III-N buffer layer under a plurality of growth conditions, and forming the III-N channel layer can comprise forming the III-N channel layer under the same or substantially the same growth conditions. The plurality of growth conditions can comprise a surface temperature and a reactor pressure. The plurality of growth conditions can further comprise a ratio of group-III precursor flow rate to group-V precursor flow rate. Forming the III-N semiconductor layer on the substrate can comprise forming the III-N semiconductor layer by metal organic chemical vapor deposition (MOCVD). The barrier layer can comprise AlGaN, the channel layer can comprise undoped or unintentionally doped (UID) GaN, and the buffer layer can comprise AlGaN or GaN or both.

Forming the III-N semiconductor layer can comprise injecting a group-III precursor into the reactor at a group-III precursor molar flow rate, and injecting the hydrocarbon precursor into the reactor can comprise injecting the hydrocarbon precursor into the reactor at a hydrocarbon precursor molar flow rate, wherein the hydrocarbon precursor molar flow rate is at least 0.02 times the group-III precursor molar flow rate. Forming the III-N semiconductor layer can comprise injecting a group-III precursor into the reactor at a group-III precursor molar flow rate, and injecting the hydrocarbon precursor into the reactor can comprise injecting the hydrocarbon precursor into the reactor at a hydrocarbon precursor molar flow rate, wherein the hydrocarbon precursor molar flow rate is greater than the group-III precursor molar flow rate. The hydrocarbon precursor can comprise propane or methane or both. Methods can further comprise adding a gate terminal, a drain terminal, and a source terminal to the semiconductor device, thereby forming a III-N high electron mobility transistor (HEMT). Methods can further comprise adding an anode terminal and a cathode terminal to the semiconductor device, thereby forming a III-N diode. Causing the III-N semiconductor layer to be insulating or semi-insulating can comprise causing the III-N semiconductor layer to have a resistivity of at least $1 \times 10^7$ ohm-cm. Carbon doping the III-N semiconductor layer can result in the III-N semiconductor layer having a carbon concentration greater than $1 \times 10^{18}$ $cm^{-3}$.

The III-N semiconductor layer can have a first side distal from the substrate and a second side between the first side and the substrate, wherein the dislocation density in the III-N semiconductor layer is a dislocation density adjacent to the first side of the III-N semiconductor layer. The III-N semiconductor layer can comprise a III-N buffer layer over a III-N nucleation layer, wherein the substrate is a silicon substrate. Devices can further comprise a III-N channel layer over the III-N buffer layer and a III-N barrier layer over the III-N channel layer, thereby forming a two-dimensional electron gas (2DEG) active channel adjacent to an interface between the channel layer and the barrier layer. The barrier layer can comprise AlGaN, the channel layer can comprise undoped or unintentionally doped (UID) GaN, and the buffer layer can comprise AlGaN or GaN or both. The substrate can be a foreign substrate. Devices can further comprise a gate terminal, a drain terminal, and a source terminal, wherein the semiconductor device is a III-N high electron mobility transistor (HEMT). Devices can further comprise an anode terminal and a cathode terminal, wherein the semiconductor device is a III-N diode. The carbon doping density in the III-N semiconductor layer can be less than $5 \times 10^{21}$ $cm^{-3}$.

Particular embodiments of the subject matter described in this specification can be implemented so as to realize one or more of the following advantages. An insulating or semi-insulating carbon doped III-N layer can be formed with a level of carbon doping from a wide range of concentrations (1e16-1e22 $cm^{-3}$) with fewer restrictions on one or more growth parameters of the layer compared to conventional technology. Insulating or semi-insulating layers can be formed with low dislocation densities and smooth surfaces grown on foreign substrates, e.g., Si or SiC substrates. Injecting a halogen free precursor (e.g., a hydrocarbon precursor)

during metalorganic chemical vapor deposition (MOCVD) can reduce or eliminate interactions of halogen containing molecules with the metalorganic precursors, thereby avoiding the influence of $CX_4$ (X=halogen) precursors on an alloy composition (i.e., the ratio of Al to Ga in AlGaN) during MOCVD growth of carbon doped AlGaN.

DESCRIPTION OF DRAWINGS

Like reference symbols in the various drawings indicate like elements.

DETAILED DESCRIPTION

Figure 1A:
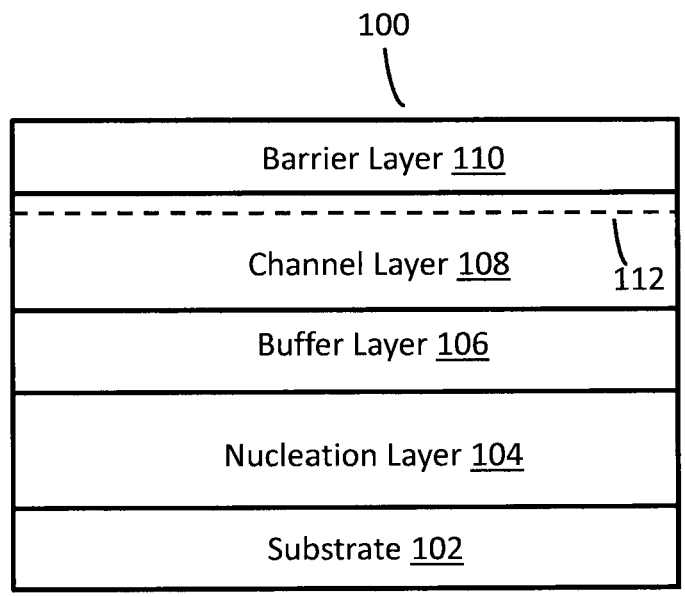
FIGS. 1A and 1B are cross-sectional views of an example III-N semiconductor device.
Figure 1B:
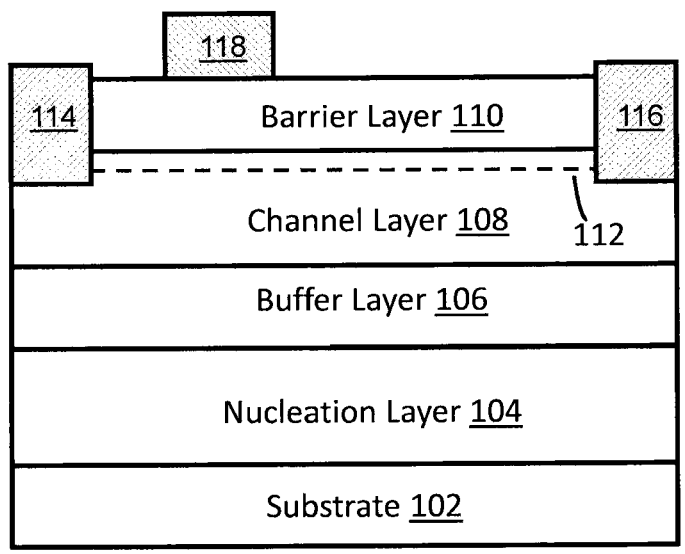

FIG. 1A is a cross-sectional view of an example III-Nitride (i.e., III-N) semiconductor device 100. For example, the device can be a transistor, e.g., a III-N high electron mobility transistor (HEMT), by adding source 114, drain 116, and gate 118 terminals to the device, as illustrated in FIG. 1B. In another example, the device can be a diode by adding anode and cathode terminals to the device (not shown).

The device includes a substrate 102. The substrate can be, e.g., silicon, SiC, aluminum nitride (AlN), GaN, sapphire ($Al_2O_3$), or any other suitable growth substrate for the growth of III-N materials. Because large native substrates (i.e., substrates formed of III-N materials) are currently unavailable and tend to be very expensive, the device is typically formed on a foreign substrate (i.e., a substrate formed of a material that is not a III-N material), such as silicon, silicon carbide, or sapphire. The device includes a nucleation layer 104 on the substrate. The nucleation layer can be a III-N nucleation layer and can include, e.g., AlN.

The device includes a buffer layer 106. The buffer layer can be a III-N buffer layer and can include, e.g., C-doped AlGaN or GaN or both. The buffer layer can include several different layers, e.g., with some layers closer to the substrate having a higher concentration of Al and some layers further from the substrate having a lower concentration of Al. The buffer layer can be made insulating or semi-insulating by carbon doping the buffer layer. This can be useful, e.g., to prevent subsurface leakage or premature breakdown.

The device includes a III-N channel layer 108 and a III-N barrier layer 110, where the compositions of the channel layer and the barrier layer are selected to induce a two-dimensional electron gas (2DEG) 112 active channel adjacent to an interface between the channel layer and the barrier layer. For example, the channel layer can include undoped or unintentionally doped (UID) GaN and the barrier layer can include AlGaN.

The terms III-Nitride or III-N materials, layers, devices, and structures can refer to a material, device, or structure comprised of a compound semiconductor material according to the stoichiometric formula $B_wAl_xIn_yGa_zN$, where w+x+y+z is about 1, and w, x, y, and z are each greater than or equal to zero and less than or equal to 1. In a III-Nitride or III-N device, the conductive channel can be partially or entirely contained within a III-N material layer.

The layers of the device can be formed by molecular beam epitaxy (MBE) or metalorganic chemical vapor deposition (MOCVD) in a reactor or other techniques. One way to achieve carbon doping in a III-N layer formed by MOCVD with $NH_3$ as the nitrogen precursor is to adjust the layer growth conditions so that carbon from metalorganic precursors (e.g., TMGa or TMAl or both) is incorporated into the layers. For example, some growth conditions that favor the incorporation of carbon include: low reactor pressure, low $NH_3$ partial pressure, low deposition temperatures, and high growth rates.

When these growth conditions are implemented for carbon doping at levels sufficient to cause a layer to be insulating or semi-insulating for certain applications, the growth conditions are limited for calibration with respect to other features of the layer, e.g., threading dislocation density and surface roughness of the layer. For example, consider a layer formed on a foreign (i.e., non-III-N) substrate, e.g., silicon (Si), silicon carbide (SiC), or sapphire ($Al_2O_3$).

Such a layer can be formed under growth conditions including one or more of lower reactor pressure, lower $NH_3$ partial pressure, lower deposition temperatures, and higher growth rates, but these growth conditions can also result in higher dislocation densities and higher levels of point defects in the layer. Increasing carbon doping levels to greater than about $5 \times 10^{18}$ cm$^{-3}$ using these methods can additionally result in surface roughening or poor surface morphology or both.

Another way to achieve carbon doping in a layer is to inject a hydrocarbon precursor into the reactor during growth of the layer. Hydrocarbon precursors include molecules of the chemical composition ($C_xH_y$), where x and y are integers greater than or equal to 1. Examples of hydrocarbons include propane ($C_3H_8$), methane ($CH_4$), and $C_2H_2$.

This way of achieving carbon doping can result in the layer having carbon doping in excess of $1 \times 10^{18}$, $5 \times 10^{18}$, $1 \times 10^{19}$, or $3 \times 10^{19}$ cm$^{-3}$ while simultaneously having a dislocation density less than $2 \times 10^9$ cm$^{-2}$, for example about $1 \times 10^9$ cm$^{-2}$ or less or about $8 \times 10^8$ cm$^{-2}$ or less. The carbon doping density in the III-N semiconductor layer can be between $1 \times 10^{19}$ cm$^{-3}$ and $5 \times 10^{21}$ cm$^{-3}$. In some implementations, the nucleation layer is between 20-50 nm thick, the buffer layer is between 1-10 microns thick (e.g., about 5 microns), the channel layer is about 200-1000 nm thick (typically about 400 nm), and the barrier layer is between 100-400 nm thick (e.g., about 250 nm).

Figure 2:
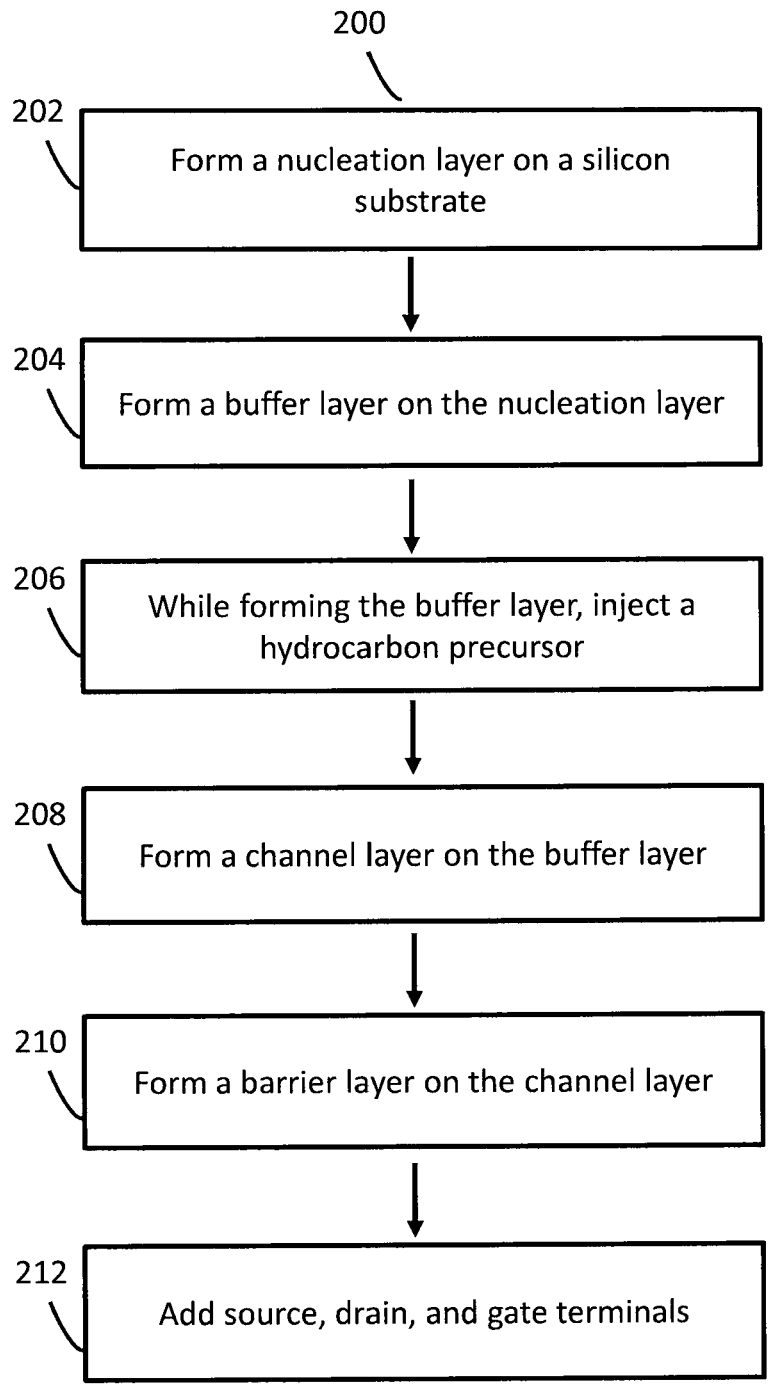
FIG. 2 is a flow diagram of an example method for fabricating a III-N semiconductor device including a carbon doped layer.

FIG. 2 is a flow diagram of an example method 200 for fabricating a III-N semiconductor device including a carbon doped layer. For purposes of illustration, the method will be described with reference to the example device 100 of FIG. 1, but the method can be used to fabricate other devices and to carbon dope other types of layers in other devices.

A nucleation layer is formed on a silicon substrate (202). For example, the silicon substrate can be placed into a reactor such as an MOCVD reactor, and the nucleation layer can be deposited, e.g., as a layer of AlN within the reactor.

A buffer layer is formed on the nucleation layer (204). For example, the buffer layer can be deposited, e.g., as a layer of AlGaN or GaN or both. In some implementations, the buffer layer comprises more than one layer. Layers of AlGaN are deposited, with a decreasing amount of Al in each successive layer. Eventually, one or more layers of GaN can be deposited.

While the buffer layer is formed, a hydrocarbon precursor is injected into the reactor (206). For example, the hydrocarbon precursor can be injected into the reactor simultaneously or alternately while injecting group III and/or group V precursors into the reactor.

A channel layer is formed on the buffer layer (208). For example, the channel layer can be deposited, e.g., as a layer of undoped or unintentionally doped (UID) GaN. In some implementations, the channel layer is formed under the same or substantially the same growth conditions as the buffer layer. Where the buffer layer includes a top level layer of GaN, the channel layer can be deposited by ceasing to inject the hydrocarbon precursor and continuing to deposit GaN without altering any other growth conditions in the reactor. That is, the reactor pressure and/or temperature and/or the total gas molar flow rate into the reactor and/or the ratio of group V precursor molar flow rate to group III precursor molar flow rate can be the same for the channel layer and for the portion of the buffer layer that is directly adjacent to the channel layer, with a hydrocarbon precursor injected into the reactor during growth of the portion of the buffer layer that is directly adjacent to the channel layer but not during growth of the channel layer.

A barrier layer is formed on the channel layer (210). For example, the barrier layer can be deposited, e.g., as a layer of AlGaN. A two-dimensional electron gas (2DEG) active channel is induced adjacent to an interface between the channel layer and the barrier layer. The barrier layer can have a larger bandgap than the channel layer, which can in turn at least partially cause the 2DEG to be induced in the channel layer. To form a transistor, source, gate, and drain terminals are then formed on the III-N material layer structure (212).

Figure 3:
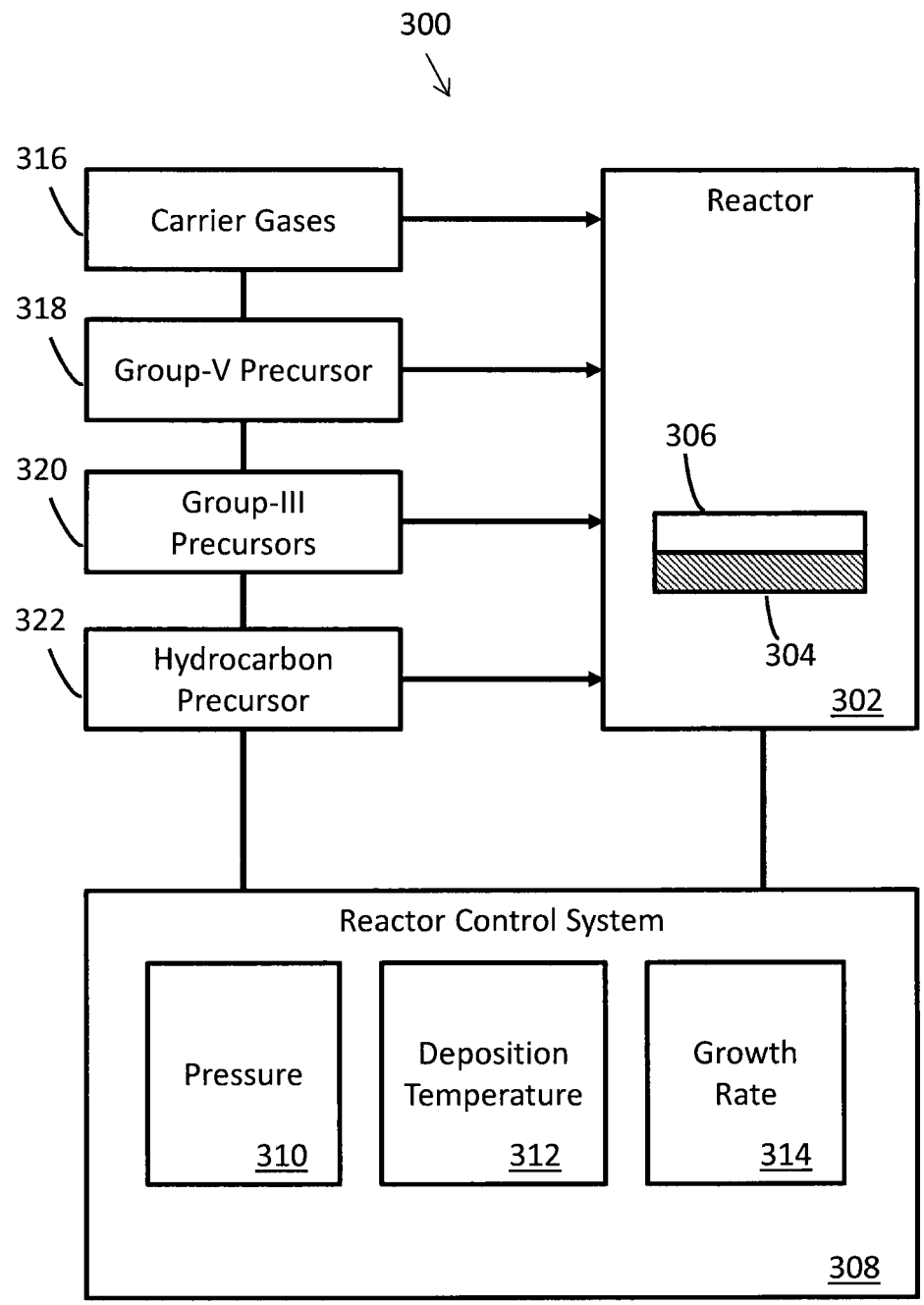
FIG. 3 is a block diagram of a system for fabricating a III-N semiconductor device with at least one layer that is carbon doped.

FIG. 3 is a block diagram of a system 300 for fabricating a III-N semiconductor device with at least one layer that is carbon doped. The system can be used, for example, to perform the method of FIG. 2 to fabricate the device of FIGS. 1A and 1B.

The system includes a reactor 302, e.g., an MOCVD reactor. A substrate 304 is placed into the reactor and a III-N layer 306 is formed on the substrate. A reactor control system 308 controls the formation of the layer 306 by adjusting one or more growth conditions. The reactor control system can control the injection of one or more materials into the reactor, including carrier gases 316 (e.g., an inert carrier gas such as $H_2$ or $N_2$ or both), group-V precursor gases 318 (e.g., $NH_3$), group-III precursor gases 320 (e.g., TMGa or TMAl or both), and hydrocarbon precursor gases 322 (e.g., one or more of $C_3H_8$, $CH_4$, and $C_2H_2$).

The reactor control system can be implemented, e.g., as a system of one or more computers that receives input from an operator and provides output control signals, e.g., to the reactor and storage modules for the gases. The reactor control system can include a pressure control module 310 (e.g., to control the pressure in the reactor), a deposition temperature control module 312 (e.g., to control the surface temperature of a layer being formed), a growth rate module 314, and other modules, for example. The growth rate module 314 may control the growth rate indirectly by controlling variables which affect the growth rate, such as reactor pressure, surface temperature, and flow rates of the various precursors and carrier gases.

In some implementations, the reactor control system is configured to form the III-N semiconductor layer by injecting a group-III precursor into the reactor at a group-III precursor molar flow rate and by injecting the hydrocarbon precursor into the reactor at a hydrocarbon precursor molar flow rate. The amount of carbon doping in the layer can be at least partially controlled by varying the ratio between the hydrocarbon precursor molar rate and the group-III precursor molar flow rate.

It has been found that for some hydrocarbon precursors for carbon doping of III-N materials during MOCVD growth of the III-N materials, in particular propane ($C_3H_8$), the dopant incorporation efficiency is much lower than the incorporation efficiency of other dopants typically introduced during MOCVD growth of III-N materials. For example, for a dopant such as silicon, where silane or disilane is used as the silicon precursor, when the ratio of the silicon precursor molar flow rate to the group-III precursor molar flow rate is about $1/1000$ (and in some cases even lower), the silicon doping level in the III-N material is approximately equal to the saturation limit of the dopant in the III-N material, which may be around $1 \times 10^{21}$ $cm^{-3}$. Increasing the silicon precursor molar flow rate relative to the group-III precursor molar flow rate to a higher value does not substantially increase the silicon doping level, and typically results in a poorer structural quality of the resulting III-N layer, for example leading to higher dislocation and point defect densities, as well as poor surface morphology. However, for carbon doping of III-N materials during MOCVD growth using propane as the carbon precursor, when the growth is performed under reactor conditions that correspond to low carbon doping levels (e.g., less than $1 \times 10^{17}$ $cm^{-3}$) in the absence of the propane precursor, adding propane at a molar flow rate of about $1/1000$ that of the group-III precursor molar flow rate does not substantially increase the carbon doping in the III-N material, and typically still yields a carbon doping level which is less than $1 \times 10^{17}$ $cm^{-3}$.

In some systems, and in particular when propane ($C_3H_8$) is utilized as the hydrocarbon precursor, a hydrocarbon precursor molar flow rate which is about or at least 0.02 times the group-III precursor molar flow rate may be needed in order for the carbon doping level in the layer to be between about $1 \times 10^{17}$ and $1 \times 10^{19}$ $cm^{-3}$, or to be in excess of $1 \times 10^{17}$ $cm^{-3}$. In some systems, when the hydrocarbon precursor molar flow rate is about or at least 0.2 times the group-III precursor molar flow rate, the carbon doping level in the layer can be about or in excess of $1 \times 10^{18}$ $cm^{-3}$, or between about $1 \times 10^{18}$ and $1 \times 10^{20}$ $cm^{-3}$. In some systems, when the hydrocarbon precursor molar flow rate is substantially greater than the group-III precursor molar flow rate, e.g., 2 times or 20 times the group-III precursor molar flow rate, the carbon doping level in the layer can be about or in excess of $1 \times 10^{19}$ or $1 \times 10^{20}$ $cm^{-3}$. The resistivity of a carbon doped layer formed with propane precursors can be greater than $1 \times 10^{7}$ ohm-cm for carbon doping levels of about $1 \times 10^{19}$ $cm^{-3}$ and greater than $1 \times 10^{8}$ ohm-cm for carbon doping levels of about $1 \times 10^{20}$ $cm^{-3}$.

In some implementations, the reactor control system is configured to form at least one layer (e.g., the UID GaN channel layer) at a surface temperature of 1077 C. and a pressure of 200 mBarr. The reactor control system flows the nitrogen precursor, e.g., ammonia ($NH_3$), into the reactor at a rate of 0.54 mol/min, flows tri-methyl gallium (TMGa) into the reactor at a rate of 0.65 milli-mol/min, and controls the total gas flow into the reactor to at or about 80 liters per minute. The reactor control system can maintain the total gas flow at a substantially constant rate by increasing or decreasing the carrier gas flow to compensate for increases or decreases in other flows. This results in carbon doping of about $5 \times 10^{16}$ $cm^{-3}$ or lower in this layer.

The reactor control system can form the carbon doped layer under the same or substantially the same growth conditions by flowing the hydrocarbon precursor into the reactor. For example, for the carbon doped layer, if the surface temperature is maintained at 1077 C., the pressure is maintained at 200 mBarr, the ammonia flow rate is maintained at 0.54 mol/min, the TMGa flow rate is maintained at 0.65 milli-mol/min, and the rate of total gas flow into the reactor is maintained at about 80 liters per minute, by flowing a hydrocarbon precursor into the reactor, carbon doping levels of greater than $1\times10^{18}$ cm$^{-3}$, greater than $1\times10^{19}$ cm$^{-3}$, or greater than $1\times10^{20}$ cm$^{-3}$ can be achieved. At the same time, if the carbon doped III-N layer is formed on a foreign substrate such as silicon, the dislocation density of the upper portion of the carbon doped III-N layer (i.e., the portion adjacent to the surface of the carbon doped III-N layer which is furthest from the substrate) can be maintained at a level smaller than $2\times10^{9}$ cm$^{-2}$, and typically even smaller than $1\times10^{9}$ cm$^{-2}$.

By way of comparison, if the hydrocarbon precursor is not flowed into the reactor during growth of the carbon doped layer, the reactor control system can adjust one or more or all of the growth parameters to incorporate enough carbon to cause the carbon doped layer to become insulating to a specified degree. For example, the reactor control system can reduce the pressure to 50 mBarr, reduce the temperature to 1020 C., reduce the NH$_3$ flow rate to 0.045 mol/min, maintain the total gas flow at about 80 liters per minute, and maintain the flow of group-III precursor gases.

These adjustments to the growth conditions can result in carbon doping of up to about $5\times10^{18}$ cm$^{-3}$. The dislocation density at the upper surface of the layer when the layers are grown under these conditions can be greater than $2\times10^{9}$ cm$^{-2}$, and is typically between $5\times10^{9}$ and $6\times10^{9}$ cm$^{-2}$. Further adjusting the reactor conditions to further increase the carbon concentration in these layers can cause substantial degradation in the surface morphology of the material structure, and typically also results in even higher dislocation densities.

A number of implementations have been described. Nevertheless, it will be understood that various modifications may be made without departing from the spirit and scope of the techniques and devices described herein. For example, the processes described herein for forming carbon doped III-N layers can be used in the fabrication of other devices that require insulating or semi-insulating layers, e.g., photovoltaic cells, lasers, and LEDs. Accordingly, other implementations are within the scope of the following claims.

What is claimed is:

1. A method of fabricating a semiconductor device, the method comprising:
   forming a III-N semiconductor layer on a substrate in a reactor, the forming of the III-N semiconductor layer comprising simultaneously injecting into the reactor a first precursor, a second precursor different from the first precursor, and a group-V precursor, wherein the first precursor is a group-III precursor and the second precursor is a hydrocarbon precursor, and the injecting of the hydrocarbon precursor causes the III-N semiconductor layer to be carbon doped, thereby causing the III-N semiconductor layer to be insulating or semi-insulating.

2. The method of claim 1, wherein the hydrocarbon precursor comprises molecules having a chemical formula ($C_xH_y$), where x and y are integers greater than or equal to 1, and the group-III precursor comprises a metalorganic precursor.

3. The method of claim 1, wherein forming the III-N semiconductor layer on the substrate comprises forming the III-N semiconductor layer as a III-N buffer layer over a III-N nucleation layer over a silicon substrate.

4. The method of claim 3, further comprising forming a III-N channel layer over the III-N buffer layer and forming a III-N barrier layer over the III-N channel layer, thereby forming a two-dimensional electron gas (2DEG) active channel adjacent to an interface between the channel layer and the barrier layer.

5. The method of claim 4, wherein forming the III-N semiconductor layer as a III-N buffer layer comprises forming the III-N buffer layer under a plurality of growth conditions, and wherein forming the III-N channel layer comprises forming the III-N channel layer under the same or substantially the same growth conditions.

6. The method of claim 5, wherein the plurality of growth conditions comprises a surface temperature and a reactor pressure.

7. The method of claim 6, wherein the plurality of growth conditions further comprises a ratio of the group-III precursor flow rate to the group-V precursor flow rate.

8. The method of claim 4, wherein the barrier layer comprises AlGaN, the channel layer comprises undoped or unintentionally doped (UID) GaN, and the buffer layer comprises AlGaN or GaN or both.

9. The method of claim 1, wherein forming the III-N semiconductor layer on the substrate comprises forming the III-N semiconductor layer by metal organic chemical vapor deposition (MOCVD).

10. The method of claim 1, wherein the hydrocarbon precursor comprises propane or methane or both.

11. The method of claim 1, further comprising adding a gate terminal, a drain terminal, and a source terminal to the semiconductor device, thereby forming a III-N high electron mobility transistor (HEMT).

12. The method of claim 1, further comprising adding an anode terminal and a cathode terminal to the semiconductor device, thereby forming a III-N diode.

13. The method of claim 1, wherein causing the III-N semiconductor layer to be insulating or semi-insulating comprises causing the III-N semiconductor layer to have a resistivity of at least $1\times10^{7}$ ohm-cm.

14. The method of claim 1, wherein causing the III-N semiconductor layer to be carbon doped results in the III-N semiconductor layer having a carbon concentration greater than $1\times10^{18}$ cm$^{3}$.

15. The method of claim 2, wherein the metalorganic precursor comprises TMGa or TMAl.

16. A method of fabricating a semiconductor device, the method comprising:
   forming a III-N semiconductor layer on a substrate in a reactor, the forming of the III-N semiconductor layer comprising simultaneously injecting into the reactor a group-III precursor, a group-V precursor, and a hydrocarbon precursor wherein the injecting of the hydrocarbon precursor causes the III-N semiconductor layer to be carbon doped, and the injecting of the group-III precursor into the reactor comprises injecting the group-III precursor at a group-III precursor molar flow rate, and the injecting of the hydrocarbon precursor into the reactor comprises injecting the hydrocarbon precursor at a hydrocarbon precursor molar flow rate, wherein the hydrocarbon precursor molar flow rate is at least 0.02 times the group-III precursor molar flow rate.

17. A method of fabricating a semiconductor device, the method comprising:
   forming a III-N semiconductor layer on a substrate in a reactor, the forming of the III-N semiconductor layer comprising simultaneously injecting into the reactor a group-III precursor, a group-V precursor, and a hydrocarbon precursor wherein the injecting of the hydrocarbon precursor causes the III-N semiconductor layer to be carbon doped, and the injecting of the group-III precursor into the reactor comprises injecting the group-III precursor at a group-III precursor molar flow rate, and the injecting of the hydrocarbon precursor into the reactor comprises injecting the hydrocarbon precursor at a hydrocarbon precursor molar flow rate, wherein the hydrocarbon precursor molar flow rate is greater than the group-III precursor molar flow rate.

18. A method of fabricating a semiconductor device, the method comprising:
forming a III-N semiconductor layer on a substrate in a reactor, the forming of the III-N semiconductor layer comprising simultaneously injecting into the reactor a group-III precursor, a group-V precursor, and a hydrocarbon precursor wherein the injecting of the hydrocarbon precursor causes the III-N semiconductor layer to be carbon doped, and the injecting of the group-III precursor into the reactor comprises injecting the group-III precursor at a group-III precursor molar flow rate, and the injecting of the hydrocarbon precursor into the reactor comprises injecting the hydrocarbon precursor at a hydrocarbon precursor molar flow rate which is different from the group-III precursor molar flow rate.

19. A method of fabricating a semiconductor device, the method comprising:
forming a first III-N semiconductor layer in a reactor, the first III-N semiconductor layer being carbon doped; and
forming a second III-N semiconductor layer on the first III-N semiconductor layer in the reactor, the second III-N semiconductor layer being undoped or unintentionally doped; wherein
the forming of the first III-N semiconductor layer comprises injecting into the reactor a group-III precursor, a group-V precursor, and a hydrocarbon precursor, and the forming of the second III-N semiconductor layer comprises injecting into the reactor the group-III precursor and the group-V precursor but not the hydrocarbon precursor.

20. The method of claim 19, wherein the group-III precursor comprises TMGa or TMAl, the group-V precursor comprises ammonia, and the hydrocarbon precursor comprises molecules having a chemical formula ($C_xH_y$), where x and y are integers greater than or equal to 1.

21. The method of claim 19, wherein the injecting of the group-III precursor into the reactor comprises injecting the group-III precursor at a group-III precursor molar flow rate, and the injecting of the hydrocarbon precursor into the reactor comprises injecting the hydrocarbon precursor at a hydrocarbon precursor molar flow rate which is different from the group-III precursor molar flow rate.

22. The method of claim 19, wherein the carbon concentration in the first III-N semiconductor layer is in excess of $1 \times 10^{17}$ cm$^{-3}$.

23. The method of claim 22, wherein the group-III precursor comprises TMGa or TMAl, the group-V precursor comprises ammonia, and the hydrocarbon precursor comprises molecules having a chemical formula ($C_xH_y$), where x and y are integers greater than or equal to 1.

24. The method of claim 22, wherein the injecting of the group-III precursor into the reactor comprises injecting the group-III precursor at a group-III precursor molar flow rate, and the injecting of the hydrocarbon precursor into the reactor comprises injecting the hydrocarbon precursor at a hydrocarbon precursor molar flow rate, wherein the hydrocarbon precursor molar flow rate is at least 0.02 times the group-III precursor molar flow rate.

25. A method of fabricating a semiconductor device, the method comprising:
forming a III-N semiconductor layer on a substrate in a reactor, the forming of the III-N semiconductor layer comprising simultaneously injecting into the reactor a group-III precursor, a group-V precursor, and a hydrocarbon precursor; wherein
the group-III precursor comprises TMGa or TMAl, the hydrocarbon precursor comprises molecules consisting of carbon and hydrogen and having a chemical formula ($C_xH_y$), where x and y are integers greater than or equal to 1, and the injecting of the hydrocarbon precursor causes the III-N semiconductor layer to be carbon doped.

* * * * *